United States Patent [19]
Ciraula et al.

[11] Patent Number: 6,046,930
[45] Date of Patent: Apr. 4, 2000

[54] MEMORY ARRAY AND METHOD FOR WRITING DATA TO MEMORY

[75] Inventors: Michael Kevin Ciraula, Round Rock; George McNeil Lattimore, Austin; Terry Lee Leasure, Georgetown; Gus Wai-Yen Yeung, Austin, all of Tex.

[73] Assignee: International Business Machines Corporation, Armonk, N.Y.

[21] Appl. No.: 09/144,871

[22] Filed: Sep. 1, 1998

[51] Int. Cl.$^7$ ................................................. G11C 11/00
[52] U.S. Cl. ................ 365/156; 365/189.04; 365/230.05
[58] Field of Search .................................... 365/154, 156, 365/230.05, 189.04

[56] References Cited

U.S. PATENT DOCUMENTS

| | | | |
|---|---|---|---|
| 4,208,730 | 6/1980 | Dingwall et al. | |
| 4,639,898 | 1/1987 | Sauer et al. | |
| 5,051,952 | 9/1991 | Gotou | 365/154 |
| 5,808,933 | 9/1998 | Ross, Jr. et al. | 365/156 |
| 5,815,432 | 9/1998 | Naffziger et al. | 365/154 |
| 5,894,434 | 4/1999 | Tran | 365/156 |
| 5,931,896 | 11/1998 | Lattimore et al. | 365/154 |

*Primary Examiner*—David Nelms
*Assistant Examiner*—Gene N. Auduong
*Attorney, Agent, or Firm*—Russell D. Culbertson; Shaffer & Culbertson, LLP; Anthony V. S. England

[57] ABSTRACT

A column (10) of a memory array includes a plurality of memory cells (11, 12) each having first and second independent access ports (T1, T2) and a cross-coupled memory latch (20). The first access port (T1) of each memory cell (11, 12) connects a first node (21) of the latch (20) to a first bit line (14), while the second access port (T2) of each memory cell connects a second node (22) of the latch (20) to a second bit line (15). A clearing arrangement (T7) is connected to the second bit line (15) for selectively coupling the second bit line to ground. A write driver is connected to the first bit line (14) for writing data to the memory cells (11, 12) in the form of single-ended signals. A memory cell is placed in a preset condition by simultaneously coupling the second node (22) to the second bit line (15) through the second access port (T2) and coupling the second bit line to ground through the clearing arrangement (T7). Once in the preset condition, data may be written to the cell by coupling the first bit line (14) to the first node (21) through the first access port (T1) and driving data to the first bit line.

15 Claims, 2 Drawing Sheets

MEMORY ARRAY AND METHOD FOR WRITING DATA TO MEMORY

TECHNICAL FIELD OF THE INVENTION

The invention relates to electronic memory devices and, more particularly, to a memory cell array and a method for writing data to the memory cells in the array.

BACKGROUND OF THE INVENTION

Memory devices for digital computers are made up of many individual memory cells arranged in an array. Each memory cell is adapted to store one bit of information. In a traditional memory cell array, groups of individual memory cells are arranged in columns with the individual cells in each column connected together by two conductors referred to as bit lines. Such a memory array may include many columns of memory cells, each column including a bit line pair. Each memory cell is commonly made up of six transistors, two access transistors and a cross-coupled memory latch including four transistors. The memory latch includes a first node connected to the first bit line through one access transistor, and a second node connected to a second bit line through the second access transistor. The access transistors of each memory cell in a traditional memory array are connected to a single conductor referred to as a word line. The memory array includes a number of word lines, each word line commonly connecting memory cells in a row across the different columns making up the array. The word lines are used to activate the access transistors of a particular memory cell for a read operation from the cell or a write operation to the cell.

The bit lines associated with a particular memory cell in a column of a memory array are used to write a bit of information to the memory cell and are also used to read information from the cell. In a traditional write operation, the particular cell in the column is selected using the word line associated with the cell and then a desired differential charge state representing a bit of information is applied to the bit line pair associated with the selected cell. The differential charge state comprises a high-level voltage signal on one bit line and a low-level voltage signal on the other bit line of the pair. A high-level voltage signal on one bit line of the pair and a low-level voltage signal on the opposite bit line represents a "1", while the opposite charge states on the bit line pair represents a "0". The memory cell stores the desired bit of data by maintaining a high charge state at one node in the memory cell and a low charge state at the other node in the cell once the access transistors are turned off or deactivated.

In a traditional read operation, a bit of information stored in a memory cell is read from the cell using the bit line pair connected to the cell, a column decoder, and a sense amplifier. The column decoder is connected to each bit line pair in the memory array and operates to select the bit line pair associated with the memory cell from which data is to be read. Before a read operation, the bit lines associated with the desired cell are both pre-charged to a high voltage level or charge state. In the read operation, the desired memory cell is selected using the word line associated with the cell to activate the access transistors of the cell. Activating the two access transistors enables the cell to apply the stored charge states to the bit lines associated with the cell. When the charge states stored by the cell are applied to the two bit lines, the voltage on one bit line remains at the high-level voltage while the voltage on the other bit line drifts to a lower voltage level. When a sufficient voltage differential develops between the bit lines, the sense amplifier converts signals on the selected bit lines to digital signals representing the data which was stored by the memory cell.

Thus, in traditional memory arrays, data was both written to and read from a memory cell as differential signals. The differential signals comprise a high charge state on one bit line and a low charge state on the opposite bit line. This differential form of data required the simultaneous use of both bit lines in the read and write operations.

A dual port memory cell is another type of prior art memory cell. A dual port memory cell may include a six-transistor arrangement which allows data to be read from a particular cell utilizing a single bit line of the bit line pair. In memory arrays made up of these dual port memory cells, the access transistors of each memory cell were coupled to a separate word line so that the access transistors were each independently controllable. These memory arrays could also be divided up into segments or sub-arrays. Each column of memory cells in a sub-array was connected to a local bit line pair and was associated with a local column decoder or multiplexing arrangement, a local read circuit, and a local write circuit. The local read circuits of the various sub-arrays were each connected to two global "data out" lines, while the local write circuits of the various sub-arrays were each connected to a global "data in" bit line pair.

Since the access transistors in this type of dual port memory cell were independently controllable through their respective word line, each access transistor could be used as an independent access port to read the charge state from a single node of a memory cell in the array. This single charge state, also referred to as a single-ended or non-differential signal, indicated the data stored by the particular cell. Since data could be read using a single bit line of the bit line pair, an array made up of these dual port memory cells could perform two read operations at the same time.

However, data was written to the dual port memory cells using differential signals. The write operation was accomplished by turning on both access transistors and applying differential signals to the cell in the form of a high charge state on one bit line and a low charge state on the opposite bit line. Since both bit lines were used simultaneously in a write operation, no part of a write operation could be performed during a read operation even though only one bit line was required for reading data from a memory cell in the array. Also, in a multiple sub-array arrangement using the six transistor dual port memory cells, the differential signals had to be sent across the global "data in" bit lines to each sub-array. This increased the wire count and space required for the memory array.

SUMMARY OF THE INVENTION

It is an object of the invention to provide a method of writing data to a memory cell array which overcomes the above-identified problems and others associated with writing data to a memory array. More particularly, it is an object of the invention to provide a method for writing data to a memory cell in the form of a single-ended or non-differential signal. It is also an object of the invention to provide a memory array structure which allows single-ended signals to be written to memory cells in the array.

To accomplish these objects, each column of memory cells in a memory array includes a clearing arrangement associated with one local bit line. The clearing arrangement clears or presets selected memory cells in the column through one bit line, and the opposite bit line is used to write data to a selected memory cell. Data is thus written into the memory cells in the form of single-ended or non-differential signals.

The memory array according to the invention is made up of memory cells having the traditional six-transistor configuration, but with independently controllable access transistors. Each memory cell includes a four-transistor cross-coupled memory latch having a first node and a second node. The first node is connected to a first bit line through a first access transistor which functions as a first independent access port to the memory cell. The second node is connected to the second bit line through a second access transistor which functions as a second independent access port to the memory cell. A write driver or buffer is connected to the first bit line for writing the desired data to the memory cells.

The clearing arrangement in the preferred form of the invention comprises means for selectively coupling the second bit line to ground. A suitable clearing transistor having a source-drain conduction path connecting the second bit line to ground may be used to selectively produce the desired coupling. The gate electrode of the clearing transistor is connected to receive a clear input signal which functions to bias the transistor to a conductive state. When the clear transistor is biased to a conductive state, the second bit line is electrically coupled to ground through the source-drain conduction path of the transistor.

According to the method of the invention, a write operation commences by applying a clear signal to the clearing transistor. The clear signal biases the clearing transistor to a conductive state, thereby electrically coupling the second bit line to ground. Once the second bit line is connected to ground, the write operation continues with the step of coupling the second node of a selected cell to the second bit line by biasing the second access transistor of the cell to a conductive state. Coupling the second node of the cell to the second bit line with the second bit line coupled to ground allows a low charge state to develop at the second node of the memory cell. The low charge state at the second node of the memory cell causes the first node to develop a high charge state. Once the low charge state fully develops at the second node and the high charge state fully develops at the first node, both the clearing transistor and the second access transistor are biased "off" or to a non-conductive state so that the second node of the memory cell is isolated from the second bit line and ground. At this point the selected memory cell is in a preset or cleared condition with a low charge state latched at the second node and a high charge state latched at the first node.

With the cell in the preset condition, the first access transistor is biased to a conductive state to electrically couple the first node to the first bit line. At the same time, the write driver associated with the particular column of the memory array drives a desired charge state on the first bit line. Where the desired charge is a high charge state, the first node remains at the preset high charge state while the second node remains at the preset low charge state. However, if the desired charge state applied to the first bit line from the write driver is a low charge state, then the first node drops to ground causing the second node to develop a high charge state. In either case, the charge states at the first and second nodes of the memory cell are developed by applying a single-ended signal through the first bit line.

The memory array and method according to the invention has several advantages over the prior memory arrays. First, the memory array according to the invention makes it possible to conduct a read operation from one memory cell through the first bit line of a column, and within the same cycle, perform portions of a write operation to write data to a different memory cell in the column. This is possible in the present invention because data may be read from one cell in the array using only the first bit line of the array and, at the same time, a clear signal may be applied to clear the second bit line. Clearing the second bit line is part of a write operation according to the invention but may be performed during a read operation accomplished using the first bit line. After the read operation, a write operation may be completed using the first bit line.

Another advantage of the invention relates to arrays which are separated into sub-arrays interconnected using global bit lines. By writing data to the memory cells in the form of single-ended signals through one bit line rather than differential signals over two bit lines, the memory array according to the invention eliminates one global bit line per column of memory cells in an array which is separated into sub-arrays.

These and other objects, advantages, and features of the invention will be apparent from the following description of the preferred embodiments, considered along with the accompanying drawings.

DESCRIPTION OF THE PREFERRED EMBODIMENTS

Figure 1:
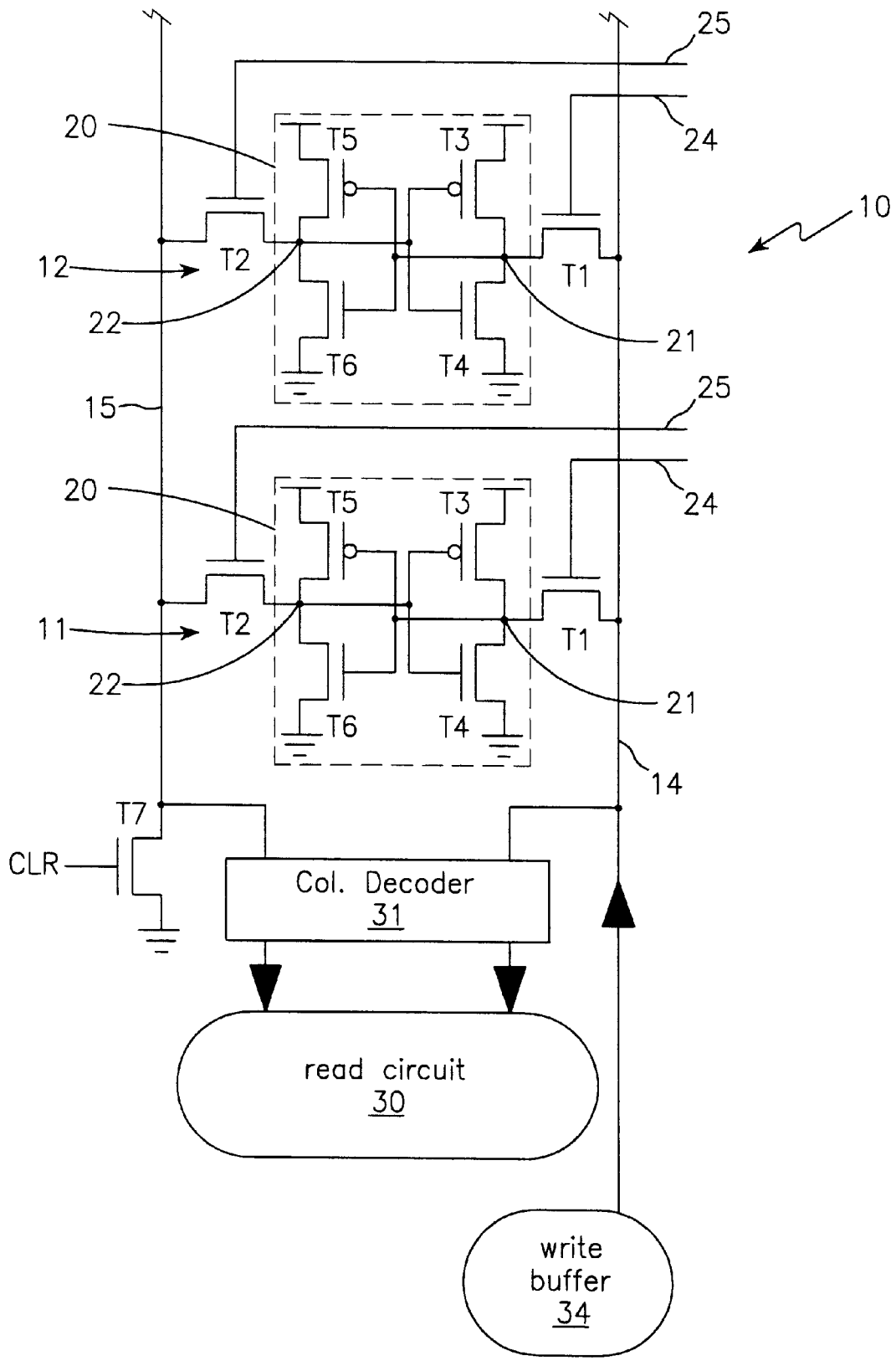
FIG. 1 is a partial electrical schematic diagram illustrating a single column of a memory array embodying the principles of the invention.

Referring to FIG. 1, a single column 10 of a memory array embodying the principles of the invention includes a plurality of identical memory cells including cells 11 and 12, each connected to a first bit line 14 and a second bit line 15. FIG. 1 shows only a small portion of a single column 10 of an array which would normally include many columns of memory cells. The two memory cells 11 and 12 shown in the small portion of the column 10 depicted in FIG. 1 are sufficient to illustrate the invention; however, those skilled in the art will appreciate that the column may include many memory cells.

Although the invention is not limited to any particular transistor technology, the preferred form of the invention is implemented using metal oxide semiconductor devices. Referring to FIG. 1, each cell 11 and 12 includes a first access transistor T1 and a second access transistor T2, both N-type field effect transistors ("FETs"). Each memory cell also includes a cross-coupled memory latch 20 including P-type FETs T3 and T5, and N-type FETs T4 and T6. The drain electrodes of transistors T3 and T4 are coupled together at a first node 21 of the respective memory cell. Similarly, the drain electrodes of transistors T5 and T6 are coupled together at a second node 22 of the respective memory cell. Transistors T3 and T5 may be referred to as a high side transistors since their respective source electrode is coupled directly to a supply voltage $V_{dd}$. Transistors T4 and T6 may be referred to as low side transistors since their respective source electrode is coupled to ground. The first node 21 is coupled to the gate electrode of each of the transistors T5 and T6, and the second node 22 is coupled to the gate electrode of each of the transistors T3 and T4.

First access transistor T1 has its source-drain conduction path connected between first node 21 and first bit line 14. Second access transistor T2 has its source-drain conduction path connected between second node 22 and second bit line 15. The gate electrode of first access transistor T1 is coupled to a first word line 24 while the gate electrode of second access transistor T2 is coupled to a second word line 25 which is independent of the first word line. Transistors T1 and T2 serve as independent first and second access ports to the respective memory cells 11 and 12. An access signal on first word line 24 biases transistor T1 to a conductive state to electrically couple first node 21 to first bit line 14. Second word line 25 applies an access signal to bias transistor T2 to a conductive state thereby electrically coupling second node 22 to second bit line 15. When transistors T1 in T2 are not biased to conduct, both nodes 21 and 22 are electrically isolated from their respective bit line 14 and 15.

Each column 10 of memory cells in a memory array according to the invention includes a cell clearing arrangement. The cell clearing arrangement in the illustrated form of the invention comprises a clearing transistor T7. Transistor T7 is an N-type FET having its source-drain conduction path connecting second bit line 15 to ground. The gate electrode of transistor T7 is connected to receive a clear signal CLR. The clear signal CLR serves to bias transistor T7 to a conductive state thereby electrically coupling second bit line 15 to ground and allowing the second bit line to discharge to a low charge state.

Still referring to FIG. 1, the first and second bit lines 14 and 15 are each coupled to a read circuit 30 through a suitable column decoder 31. The read circuit 30 operates to read data from the memory cells 11 and 12 in the form of single-ended signals on either the first bit line 14 or second bit line 15. Details concerning this read operation are omitted here in as much as such details are not necessary to obtain a complete understanding of the present invention and are, in any event, within the knowledge of those skilled in the art.

A write driver or buffer 34 is coupled to first bit line 14. This arrangement is to be distinguished from a differential write driver arrangement which would be connected to both the first bit line and second bit line in order to write data in the form of differential signals. Write driver 34 operates to drive data in the form of a particular charge state or voltage level to first bit line 14, and to the selected memory cells such as cells 11 and 12. The desired data may be represented by a high charge state, near the supply voltage level $V_{dd}$ for example, or a low charge state which may be near 0.0 volts. The high charge state may represent a "1" to be stored in the selected cell while the low charge state may represent a "0" to be stored.

The method of writing data to a memory array may now be described with reference to FIG. 1. The method includes applying a clear signal CLR to the gate electrode of clearing transistor T7. The clear signal CLR biases transistor T7 to a conductive state causing the charge state of the second bit line 15 to fall quickly to near 0.0 volts. One of the cells in the column 10 may then be selected for a clear operation through the second word line 25 associated with the particular cell. For example, cell 11 may be selected for clearing by applying a suitable access signal through the respective second word line 25 to the gate electrode of second access transistor T2. The access signal biases transistor T2 to a conductive state in which the transistor electrically couples second node 22 to second bit line 15. Since second bit line 15 is electrically coupled to ground through transistor T7 at this point, second node 22 also drops to the low charge state near 0.0 volts when transistor T2 is biased to a conductive state. The low charge state at the second node 22 of memory cell 11 biases the low side transistor T4 "off" and high side transistor T3 "on" or to a conductive state causing first node 21 of the memory cell to be coupled to the supply voltage $V_{dd}$ and producing a high charge state at the first node 21.

Thus, simultaneously activating second access transistor T2 and clearing transistor T7 places the selected cell in a cleared or preset condition with a low charge state at second node 22 and a high charge state at first node 21. Once the desired preset charges are developed at the first and second nodes 21 and 22, transistor T2 may be turned "off" to isolate the nodes in the preset condition. Clearing transistor T7 may also then be turned "off", that is, biased to a non-conductive state.

With the memory cell 11 in the preset condition, data may be written to the cell through first bit line 14. The desired data is written by biasing first access transistor T1 to a conductive state through first word line 24 and operating the write driver 34 to apply a desired charge state to first bit line 14. Biasing first access transistor T1 to a conductive state electrically couples first node 21 to first bit line 14. If the desired data is represented by a high charge state on first bit line 14, first node 21 remains at the high preset charge state and second node 22 remains at the low preset charge state. However, if the desired data is represented by a low charge state on first bit line 14, the voltage at first node 21 drops quickly to a low charge state. This low charge state at first node 21 is applied to the gate electrodes of transistors T5 and T6, turning transistor T6 "off" and transistor T5 "on" to couple second node 22 to the supply voltage $V_{dd}$. Thus the low charge state at first node 21 forces a high charge state at second node 22.

Once the first access transistor T1 is activated for a sufficient period of time to allow first node 21 to reach the desired charge state and second node 22 to reach the opposite charge state, transistor T1 is biased to a non-conductive state through first word line 24. At this point, the first and second nodes 21 and 22 are isolated from the bit lines 14 and 15 and latched at complementary charge states representing the desired data, a "1" or a "0". The stored data may then be read from cell 11 either through first bit line 14 and/or second bit line 15 as single-ended signals or as differential signals. Read circuit 30 is preferably adapted to read the data as a single-ended signal from either the first or second bit line.

The preferred form of the invention illustrated in FIG. 1 may be modified in many respects within the scope of the present invention. For example, any suitable transistor type may be used rather than the illustrated complementary metal oxide semiconductor devices. Also, the cells may be cleared through first bit line 14 rather than second bit line 15. In this alternate form of the invention a P-type FET (not shown) may be connected with its drain-source conduction path connecting the first bit line to a supply voltage. The gate electrode of this alternate clearing transistor would be connected to receive a clear signal comprising a low-level voltage signal.

Figure 2:
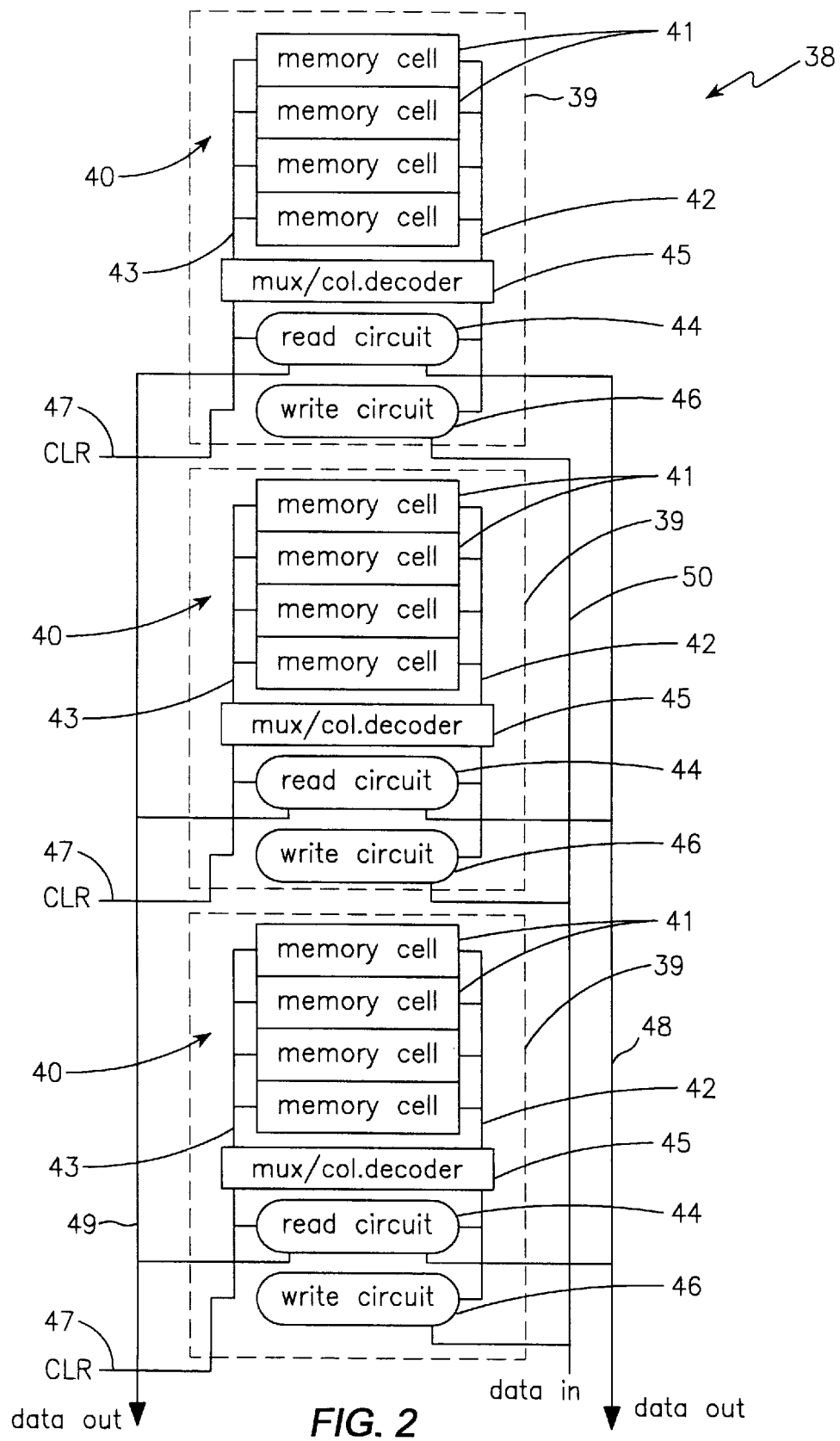
FIG. 2 is a diagrammatic representation of a high-performance memory array embodying the principles of the invention.

The memory array and write method according to the invention are particularly applicable to high-performance memory arrays made up of a plurality of sub-arrays. Such a high-performance array 38 incorporating the invention is shown in FIG. 2. Each sub-array 39 shown in FIG. 2 includes preferably a plurality of memory cell columns 40 similar to the column 10 illustrated in FIG. 1. Only one column 40 is shown in each sub-array 39 in FIG. 2 for purposes of describing the invention. Of course, many columns may be included in each sub-array. The columns 40 each include a plurality of memory cells 41 connected to a first bit line 42 and a second bit line 43. Each sub-array 39 also includes a local read circuit 44 which reads the column through a suitable multiplexing or column decoder arrangement 45 connected to both the first and second bit lines 42 and 43 of each column in the sub-array. A write driver 46 is also associated with each sub-array 39 and connected to each first bit line. A clear input 47 for each sub-array 39 provides a clear signal to a clearing device which is not shown in FIG. 2 due to the scale of the drawing, but may comprise a clearing transistor such as transistor T7 shown in FIG. 1.

Data which is read from the individual arrays 39 is transferred from the local read circuits 44 to first and second global data out lines, 48 and 49 respectively. The write driver 46 of each sub-array 39 is connected to a single global data in line 50 through which data is transferred to the local write circuits for writing to the memory sub-arrays.

One major advantage of the write method according to the invention is readily apparent in FIG. 2. The segmented high-performance memory array 38 requires only a single global data in line 50 rather than the two global data in lines required in a differential write arrangement. Another major advantage of the invention is that it allows read and write operations to overlap. As discussed above with reference to FIG. 1, the clearing operation does not affect or require the cooperation of the first bit line 14. It is therefore possible to read data from one cell in the array on the first bit line 14 and simultaneously clear or preset another cell through the second bit line 15. Since the preset operation does not affect the first bit line 14, the preset operation does not interfere with a single-ended signal read from another cell on the first bit line.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A memory array column comprising:
   (a) a plurality of memory cells, each memory cell comprising a cross coupled memory latch having two high side transistor devices coupled continuously to a supply voltage and two low side transistor devices coupled continuously to ground, and further having a first node and a second node interconnected such that a given charge state on one of the first and second nodes produces an opposite charge state on the other of the first and second nodes;
   (b) each memory cell having a first independent access port connecting the first node of the respective memory cell to a first bit line;
   (c) each memory cell having a second independent access port connecting the second node of the respective memory cell to a second bit line;
   (d) a cell clearing arrangement comprising a clearing transistor having its source-drain conduction path coupling the second bit line to ground for producing a preset condition in each selected memory cell in response to a clear input, each selected memory cell comprising a memory cell selected through the independent second access port associated with the respective cell, and the preset condition comprising a low charge state at the second node and a high charge state at the first node of the selected memory cell; and
   (e) a write driver connected to the first bit line for driving a desired charge state on the first bit line.

2. The apparatus of claim 1 further comprising:
   (a) a single-ended read apparatus connected to both the first bit line and the second bit line.

3. The apparatus of claim 1 wherein the memory array column is included in a sub-array connected to first and second data out lines and a single data in line.

4. A method of writing data to a memory cell comprising a cross coupled memory latch having two high side transistor devices coupled continuously to a supply voltage and two low side transistor devices coupled continuously to ground, the memory cell having a first node connected to a first bit line through a first access port, and also having a second node connected to a second bit line through a second access port, the method comprising the steps of:
   (a) coupling the second bit line to ground and coupling the second node to the second bit line through the second access port, thereby producing a low charge state at the second node;
   (b) producing a high charge state at the first node in response to the low charge state at the second node;
   (c) isolating the second node from the second bit line at the second access port;
   (d) coupling the first node to the first bit line through the first access port;
   (e) with the first node and first bit line coupled through the first access port and with each low side transistor device coupled to ground, applying a desired charge state to the first bit line, thereby producing the desired charge state at the first node; and
   (f) producing an opposite charge state at the second node in response to the desired charge state at the first node.

5. The method of claim 1 wherein the first access port comprises a first port transistor having a source-drain conduction path connecting the first node and the first bit line, and the step of coupling the first node to the first bit line comprises:
   (a) applying a biasing signal to a gate electrode of the first port transistor to place said transistor in a conductive state.

6. The method of claim 1 wherein the second access port comprises a second port transistor having a source-drain conduction path connecting the second node to the second bit line and the step of coupling the second node to the second bit line comprises:
   (a) applying a biasing signal to a gate electrode of the second port transistor to place said transistor in a conductive state.

7. The method of claim 1 wherein the step of producing a high charge state at the first node in response to the low charge state at the second node comprises:
   (a) applying the low charge state at the second node to bias the high side transistor associated with the first node to a conductive state, thereby coupling the first node to a supply voltage source.

8. The method of claim 1 wherein the desired charge state is a high charge state and the step of producing the opposite charge state at the second node comprises:
   (a) applying the high charge state at the first node to bias the low side transistor associated with the second node to a conductive state, thereby coupling the second node to ground.

9. The method of claim 1 wherein the desired charge state is a low charge state and the step of producing the opposite charge state at the second node comprises:
   (a) applying the low charge state at the first node to bias the high side transistor associated with the second node to a conductive state, thereby coupling the second node to a supply voltage source.

10. A method of writing data to a memory cell through a single bit line, the memory cell comprising a cross coupled memory latch having two high side transistor devices coupled continuously to a supply voltage and two low side transistor devices coupled continuously to ground, the method comprising the steps of:

(a) producing a preset charge state at a second node of the memory cell and producing at a first node of the memory cell a charge state which is opposite to the preset charge state;

(b) isolating the second node from a second bit line and isolating the first node from a first bit line;

(c) coupling a first node of the memory cell to a first bit line through a first access port;

(d) with the first node and the first bit line coupled together through the first access port and with both low side transistor devices coupled to ground, applying a desired charge state to the first bit line, thereby placing the desired charge state on the first node; and (e) in response to the desired charge state at the first node, producing an opposite charge state at the second node.

11. The method of claim 10 wherein the first access port comprises a first port transistor having a source-drain conduction path connecting the first node and the first bit line, and the step of coupling the first node to the first bit line comprises:

(a) applying a biasing signal to a gate electrode of the first port transistor to place the first port transistor in a conductive state.

12. The method of claim 10 wherein the step of producing the preset charge state at the second node comprises:

(a) coupling a second bit line to ground; and (b) coupling the second node to the second bit line through a second port transistor having a source-drain conduction path connecting the second node to the second bit line.

13. The method of claim 10 wherein the step of producing a charge state at the first node which is opposite to the preset charge state at the second node comprises:

(a) applying the preset charge state at the second node to bias a transistor set associated with the first node, thereby coupling the first node to a voltage source at a charge state opposite to the preset charge state.

14. The method of claim 10 wherein the desired charge state is a high charge state and the step of producing the opposite charge state at the second node comprises:

(a) applying the high charge state at the first node to bias the low side transistor associated with the second node to a conductive state, thereby coupling the second node to ground.

15. The method of claim 10 wherein the desired charge state is a low charge state and the step of producing the opposite charge state at the second node comprises:

(a) applying the low charge state at the first node to bias the high side transistor associated with the second node to a conductive state, thereby coupling the second node to a supply voltage source.

* * * * *

UNITED STATES PATENT AND TRADEMARK OFFICE
CERTIFICATE OF CORRECTION

PATENT NO. : 6,046,930
DATED : April 4, 2000
INVENTOR(S) : Michael K. Ciraula, et al.

It is certified that error appears in the above-identified patent and that said Letters Patent is hereby corrected as shown below:

Claim 5, column 8, line 32 of the Patent, change "claim 1" to --claim 4--.

Claim 6, column 8, line 40 of the Patent, change "claim 1" to --claim 4--.

Claim 7, column 8, line 48 of the Patent, change "claim 1" to --claim 4--.

Claim 8, column 8, line 55 of the Patent, change "claim 1" to --claim 4--.

Claim 9, column 8, line 62 of the Patent, change "claim 1" to --claim 4--.

Signed and Sealed this

Thirtieth Day of January, 2001

Attest:

Q. TODD DICKINSON

*Attesting Officer*    *Director of Patents and Trademarks*